United States Patent
Chen et al.

(10) Patent No.: US 7,323,859 B2
(45) Date of Patent: Jan. 29, 2008

(54) AUTO-MEASURING UNIVERSAL METER

(75) Inventors: Win-Throng Chen, Taipei County (TW); Shou-Hua Lin, Keelung (TW)

(73) Assignee: APPA Technology Corp., Taipei (TW)

( * ) Notice: Subject to any disclaimer, the term of this patent is extended or adjusted under 35 U.S.C. 154(b) by 0 days.

(21) Appl. No.: 11/488,697

(22) Filed: Jul. 19, 2006

(65) Prior Publication Data

US 2007/0200573 A1 Aug. 30, 2007

(30) Foreign Application Priority Data

Feb. 15, 2006 (TW) ............... 95105061 A

(51) Int. Cl.
*G01R 1/38* (2006.01)
(52) U.S. Cl. ............. 324/116; 324/126; 324/127
(58) Field of Classification Search ............ 324/116
See application file for complete search history.

(56) References Cited

U.S. PATENT DOCUMENTS

| | | | | |
|---|---|---|---|---|
| 4,728,887 A * | 3/1988 | Davis | ............... | 324/127 |
| 5,140,257 A * | 8/1992 | Davis | ............... | 324/106 |
| 5,572,117 A * | 11/1996 | Yoon | ............... | 324/115 |
| 5,610,512 A * | 3/1997 | Selcuk | ............... | 324/127 |
| 5,839,633 A * | 11/1998 | Fisher | ............... | 224/675 |
| 5,875,413 A * | 2/1999 | Vinci | ............... | 702/91 |
| 6,043,640 A * | 3/2000 | Lauby et al. | ............... | 324/127 |
| 6,456,060 B1 * | 9/2002 | Wiesemann | ............... | 324/127 |
| 6,646,562 B1 * | 11/2003 | Chang | ............... | 340/664 |

* cited by examiner

*Primary Examiner*—Ha Tran Nguyen
*Assistant Examiner*—Richard Isla-Rodas
(74) *Attorney, Agent, or Firm*—Troxell Law Office, PLLC

(57) ABSTRACT

An auto-measuring universal meter is disclosed. The auto-measuring universal meter includes a main unit having a display and a single button. A pair of test probes is electrically connected to the main unit in a removable manner to detect a first input signal; an inductive clamp is formed on and electrically connected to the main unit for gripping a current-carrying conductor to detect a second input signal indicative of an alternating/direct current flowing through the current-carrying conductor. The main unit is designed so as to take measurement of the input signals in a self-judging mode based on the presence of and/or the differences between the input signals so that the alternating/direct current can also be measured.

4 Claims, 5 Drawing Sheets

AUTO-MEASURING UNIVERSAL METER

FIELD OF THE INVENTION

The present invention relates to an auto-measuring universal meter and, more particularly, to an auto-measuring universal meter which can measure current as well as voltage, resistance and the like by taking measurement of input signals in a self-judging mode so that a user may operate simply by pressing a single button.

BACKGROUND OF THE INVENTION

A universal meter, either an electronic type or a mechanical type, typically have a function selector which can be turned manually to a particular angular position to select the measurement item and range as required. However, the selection often depends on an estimation about what is to be measured and how much it is. Erroneous selection will lead to an erroneous result in the measurement and, particularly in the measurement of high voltage and current, will bring a danger to the operator as well as to the meter itself.

Auto-measuring universal meters that can be used without selection are available now. Although such meters are easy to be operated, they can measure only voltage and resistance except current.

Therefore, there is a need for the improvement of the auto-measuring universal meter to overcome the shortcomings of the prior art.

OBJECTIVES OF THE INVENTION

It is an objective of the present invention to provide an auto-measuring universal meter which can measure current as well as voltage, resistance, and the like.

Another objective of the present invention is to provide an auto-measuring universal meter in which a correctly measured result will be displayed without any operation by the user after the meter is turned on.

Still another objective of the present invention is to provide an auto-measuring universal meter in which the measured result can be displayed in any desired visual mode by pressing a single button.

Still another objective of the present invention is to provide an auto-measuring universal meter in which the steadily measured result of a current will be displayed automatically without pressing of the single button.

Still another objective of the present invention is to provide an auto-measuring universal meter in which the background of a display will be brightened automatically in response to the environmental darkness.

Still another objective of the present invention is to provide an auto-measuring universal meter which will warn the operator of possible danger during the measurement.

SUMMARY OF THE INVENTION

To achieve the aforementioned objective, the present invention provides an auto-measuring universal meter including a main unit having a display and a single button. A pair of test probes is electrically connected to the main unit in a removable manner to detect a first input signal, and an inductive clamp is formed on and electrically connected to the main unit for gripping a current-carrying conductor to detect a second input signal indicative of an alternating/direct current flowing through the current-carrying conductor. The main unit is designed so as to take measurement of the input signals in a self-judging mode based on the presence of and/or the differences between the input signals so that the alternating/direct current can also be measured.

Other objectives, advantages and novel features of the present invention will become more apparent from the following detailed description when taken in conjunction with the accompanying drawings.

DETAILED DESCRIPTION OF THE PREFERRED EMBODIMENT

Figure 1:
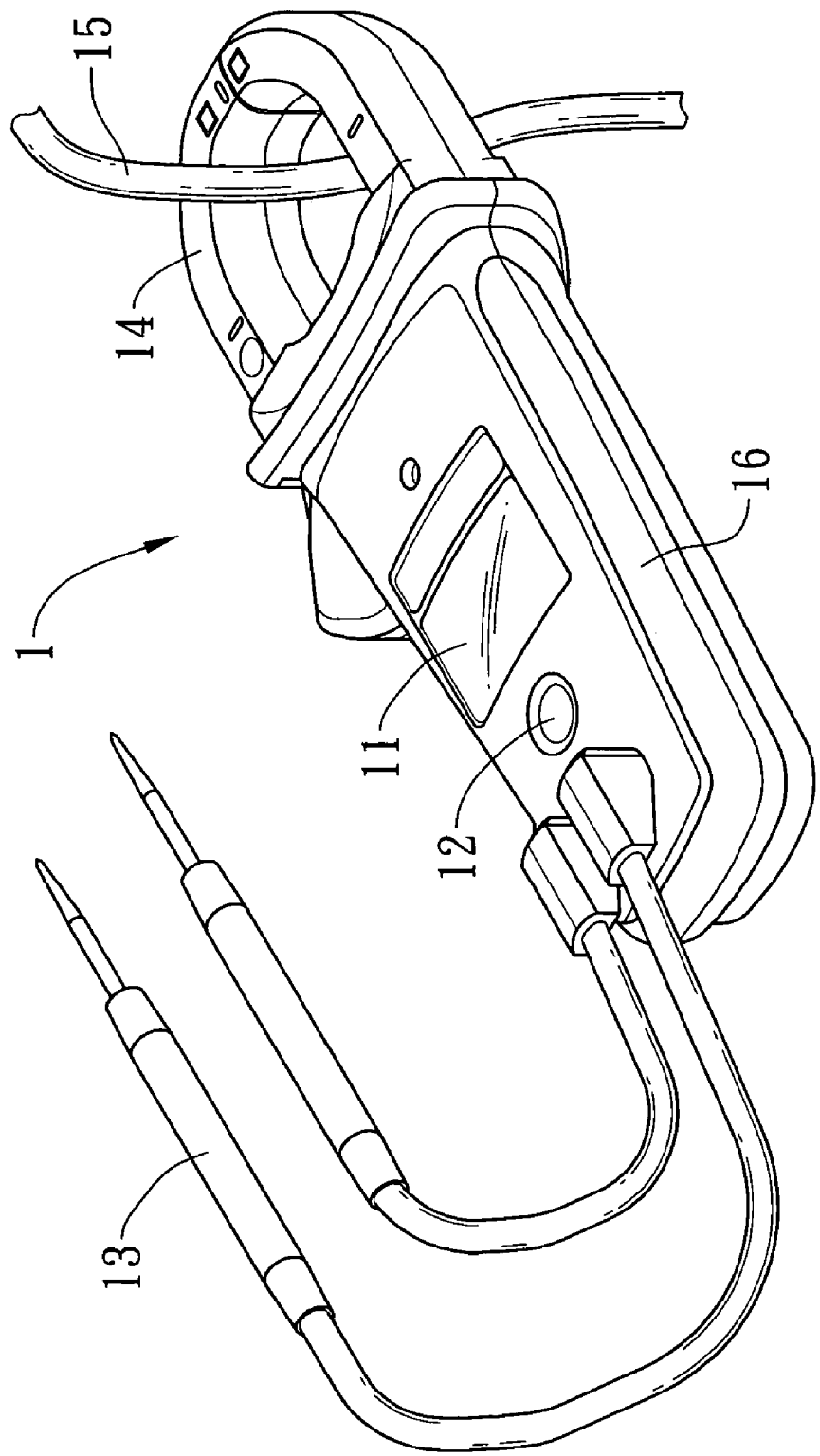
FIG. 1 is a perspective view of an auto-measuring universal meter of an embodiment of the present invention.

Referring to FIG. 1, there is shown a preferred embodiment of an auto-measuring universal meter in accordance with the present invention. The universal meter includes a main unit 1 having a display 11 and a single button 12, with a pair of test probes 13 electrically connected to the main unit 1 in a removable manner to detect a first input signal, and with an inductive clamp 14 formed on and electrically connected to the main unit 1 for gripping a current-carrying conductor 15 to detect a second input signal indicative of an electric current flowing through the conductor 15.

Figure 2:
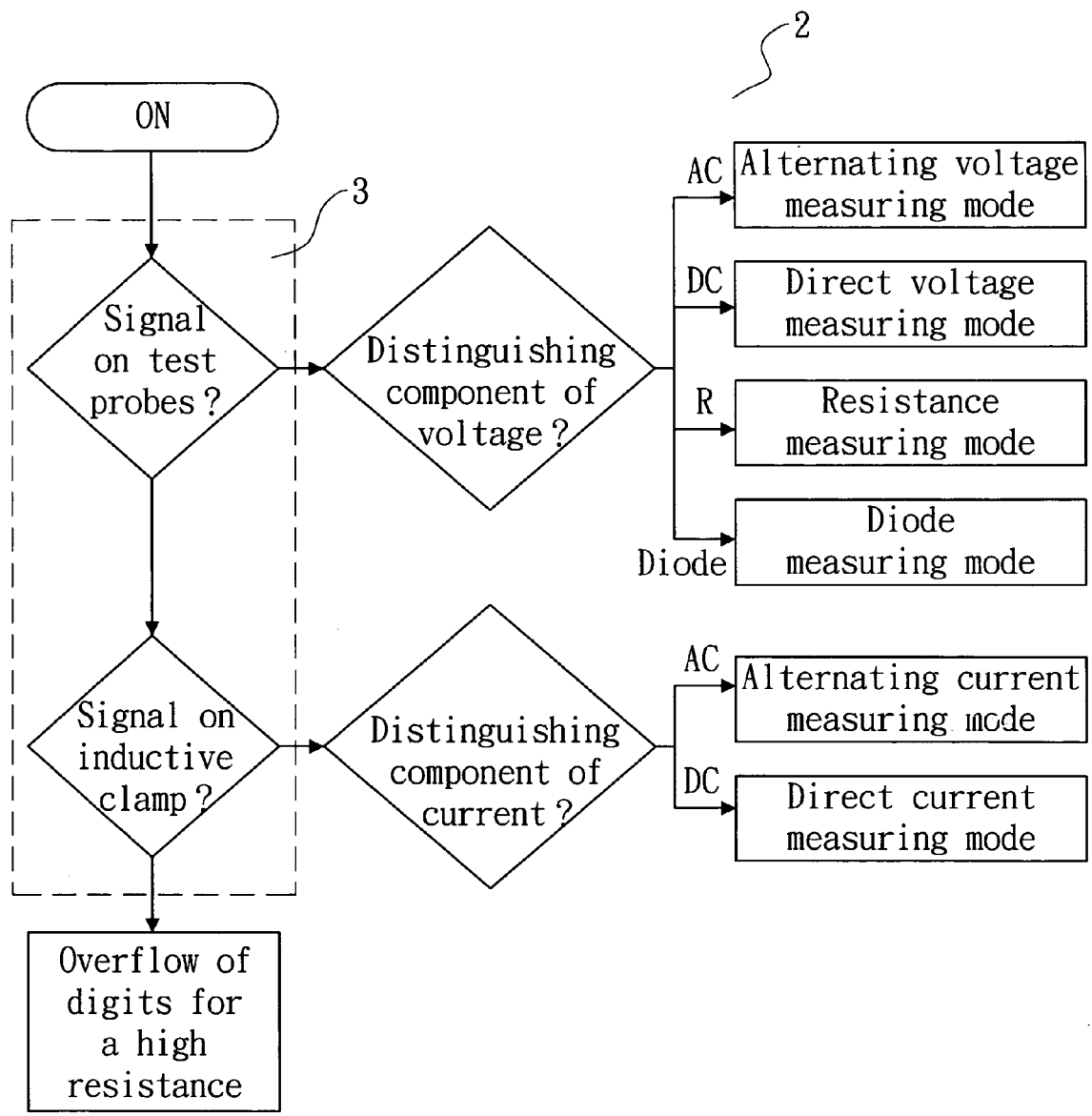
FIG. 2 is a flow chart illustrating how measurement is made in a self-judging mode of an embodiment of the present invention.

Referring still to FIG. 1 and additionally to FIG. 2, the main unit 1 is designed so as to take measurement of these input signals in a self-judging mode 2 based on the presence of and/or differences between the input signals, preferably based on a criterion 3 that the first input signal takes priority for measurement over the second input signal, so that alternating/direct current can be measured in addition to alternating/direct voltage, resistance, and diode.

That is to say, the main unit 1 can change its functions so intelligently that a user may operate it simply by pressing the single button 12, thus simplifying the operation of user and avoiding possible dangers to the meter, the user, or both together due to an erroneous operation by the user. The inventive universal meter is also advantageous in that the main unit 14 can be held on an electric cord by the inductive clamp 14 to facilitate observation of the measured result on the display 11.

The main unit 1 preferably has a buzzer 16 enclosed therein to produce beeping sound if necessary, and more preferably has a handy casing tapered from top towards bottom in such a way that the user may hold the main unit 1 with one hand and may press the button 12 with a finger of the same hand.

Figure 3:
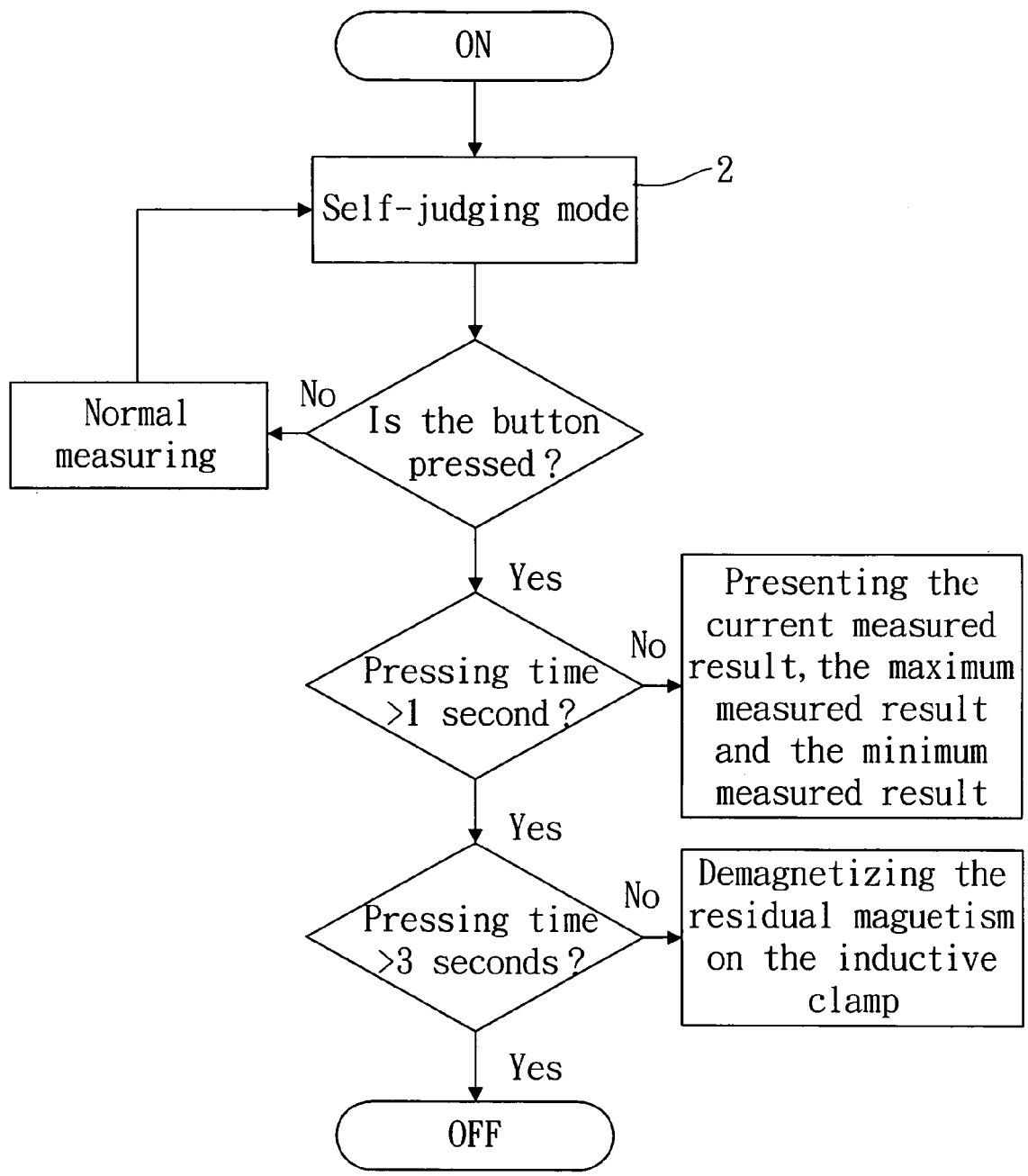
FIG. 3 is a flow chart illustrating reaction of the meter to the pressing on a single button of an embodiment of the present invention.

Referring still to FIG. 1 and additionally to FIG. 3, the main unit 1 can be turned on by pressing the single button 12 for less than 2 seconds so as to additionally activate an automatic turnoff mode, in which the main unit 1 will be turned off automatically after has been idle for a period of time, such as for 20 minutes. When the automatic turnoff mode is active, the single button can be pressed for less than 1 second to activate a holding visual mode in which a measured result is kept unchanged on said display 11, and which then can be deactivated by pressing the single button 12 for less than 1 second again.

Preferably, the holding visual mode is activated with a beep from the buzzer 16 and with a word "HOLD" on the display 11, and is deactivated with a beep again.

However, when the automatic turnoff mode is active during the measuring of electric current, occurrence of a steady current having a measured result above or equal to a preset minimum current value, such as 3 A, will automatically activate an auto-holding visual mode in which the measured result on the display will be automatically refreshed as soon as a subsequent steady current having a measured result above or equal to the preset minimum current value and over 0.2 A above or below the measured result on the display is measured. It is also preferable that the auto-holding visual mode is activated with three beeps from the buzzer 16 and with two words "AUTO" and "HOLD" on the display 11.

When the auto-holding visual mode is active, the single button 12 can be pressed, preferably with a peep again, to deactivate the auto-holding visual mode by activating the holding visual mode. This auto-holding visual mode will also be deactivated automatically if the inductive clamp 15 detects nothing but a current which has a measured result below the preset minimum current value or a unsteady one during a period of time about 5 seconds. Furthermore; the auto-holding visual mode will be deactivated and replaced by other visual mode as soon as there is an input signal detected by the test probes 13.

The main unit 1 can also be turned on by pressing the single button 12 for more than 2 seconds so as to additionally activate a manual turnoff mode in which the main unit 1 must be turned off manually. When the manual turnoff mode is active during the measurement of alternating/direct voltage or alternating/direct current, the single button can be pressed for less than 1 second to activate a max/min record visual mode in which the maximum and minimum measured results will be found since the activation of the max/min record visual mode are put on record. When the max/min record visual mode is active, the single button 12 can be pressed for less than 1 second repeatedly to present the maximum measured result, the minimum measured result, and a currently measured result on the display 11 turn and turn around.

In a highly preferred embodiment, the max/min record visual mode is activated with a beep produced from the buzzer 16 and with the currently measured result and an additional word "RECORD" presented on the display 11. The single button 12 then can be pressed for less than 1 second with a beep again to present the maximum measured result and an additional word "MAX" on the display 11. Then the single button 12 can be pressed for less than 1 second with a beep once again to present the minimum measured result and an additional word "MIN" on the display 11, and then the single button 12 can be pressed for less than 1 second with a beep again to present the currently measured result and the word "RECORD" on the display 11.

In the present invention, when any of the turnoff modes and visual modes is active the single button 12 can also be pressed either for more than 3 seconds to turn off the main unit 1, or for more than 1 second but less than 3 seconds to activate a demagnetizing mode in which the main unit 1 operates so as to remove the residual magnetism left in the inductive clamp 15 during the measurement of the direct current, as shown in FIG. 3. Preferably, signs "DC", "0.0", "A" and "ZERO" are presented on the display 11 for about 2 seconds during the process of demagnetizing the residual magnetism on the inductive clamp 15.

Referring back to FIG. 2, the self-judging mode 2 includes an alternating voltage measuring mode, a direct voltage measuring mode, an alternating current measuring mode, a direct current measuring mode, a resistance measuring mode, and a diode measuring mode. As mentioned above, the main unit 1 takes measurement of the input signals in the self-judging mode 2 based on the criterion 3 that the first input signal detected by the test probes 13 takes priority for measurement over the second input signal detected by the inductive clamp 14. That is to say, the measured result of an alternating/direct voltage, a resistance, or a diode is presented on the display 11 as long as the pair of test probes 13 detects an input signal measurable in any of the alternating voltage measuring mode, the direct voltage measuring mode, the resistance measuring mode, and the diode measuring mode. The measured result of an current is presented on the display 11 only when the inductive clamp 14 detects a measurable input signal but the pair of test probes 13 detects no measurable input signal, and a sign "OL" representing overflow of digits for a high resistance is presented on the display 11 when neither the pair of test probes 13 nor the inductive clamp 14 detects a measurable input signal.

This means that the inventive universal meter can be used to measure electric current simply by bringing the test probes 13 into contact with nothing while the main unit 1 is held on an electric cord by the inductive clamp 14.

Figure 4:
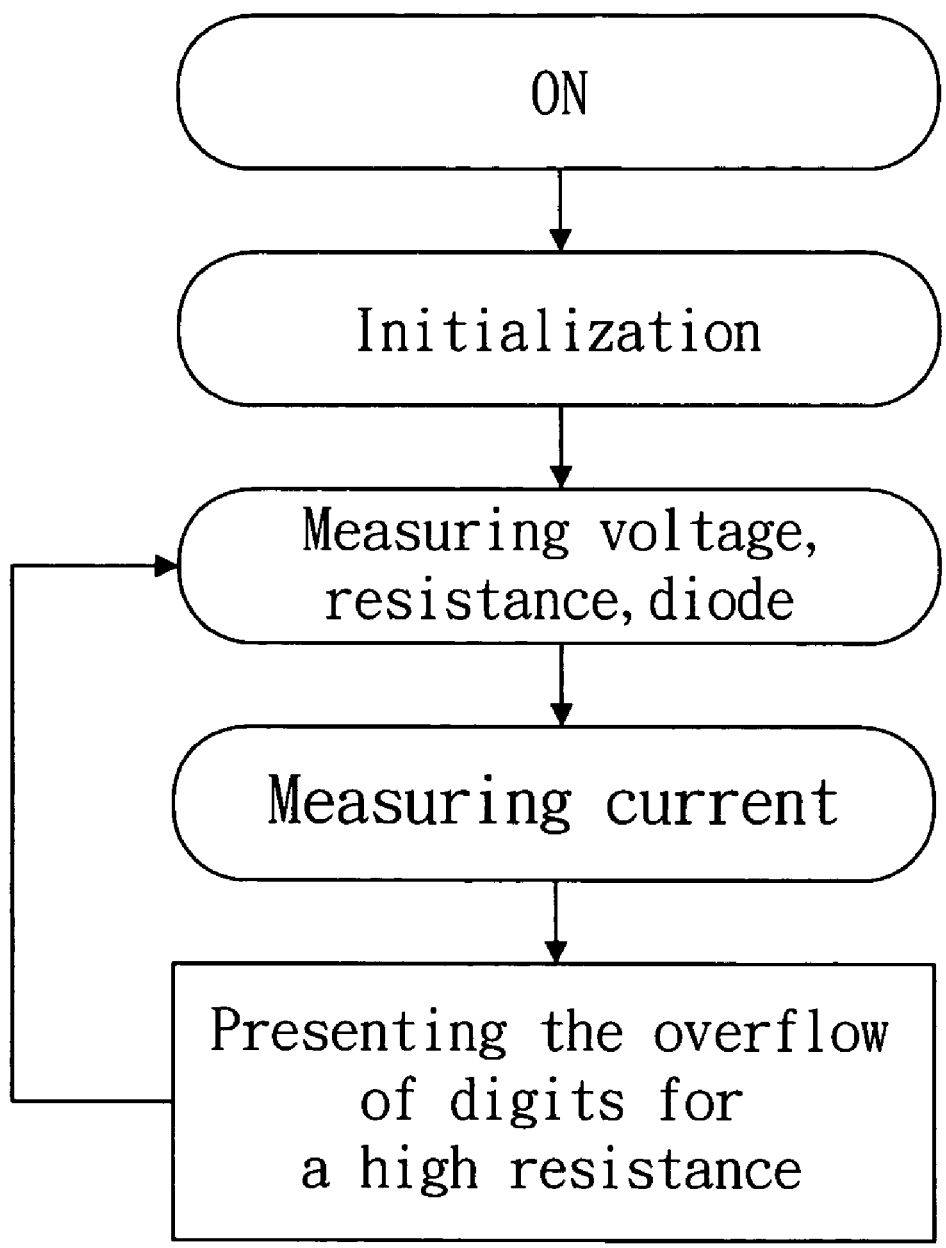
FIG. 4 is a flow chart illustrating the procedure of judgments in association with the self-judging mode of the present invention.

Referring to FIG. 4, as soon as the initialization and a self-test for the power of enclosed batteries/cells are completed after the main unit 1 was turned-on, both a direct voltage and an alternating voltage are measured, and then judgments in association with the self-judging mode are made, as follows:

a. If the direct voltage has a measured result with an absolute value above 999.9 V and the alternating voltage has a measured result also above 999.9 V, a sign "OL" representing overflow of digits for both of the voltages will be presented on the display 11; if only the direct voltage has a measured result with an absolute value above 999.9 V, a sign "OL" is present on the display 11 only for the direct voltage;

b. Provided that the direct voltage has a measured result in a range either between 2.1V or 999.9V or between −0.5V to −999.9V, a further judgment is made whether the alternating voltage has a measured result above 999.9V or not; if it does, a sign "OL" will be presented on the display 11 for the alternating voltage; if it does not, the value of alternating voltage will be presented on the said display 11 only when that value is greater than the absolute value of the direct voltage, or the value of direct voltage will be presented;

c. Provided that the direct voltage has a measured result below 2.1V but above −0.5 V, if the alternating voltage has a measured result in a range between 1.0V and 999.9 V, the measured result of the alternating voltage will be presented on the display 11; if the alternating voltage has a measured result above 999.9V, a sign "OL" will be presented on the display 11 for the alternating voltage; and if the alternating voltage has a measured result below or equal to 0.9V, the operation of the main unit 1 will be switched automatically either to the resistance measuring mode in case the absolute value of the direct voltage is below or equal to 1.1V or to the diode measuring mode in case the absolute value of the direct voltage is above 0.2V;

d. In the resistance measuring mode, if the resistance has a measured result below 10,000Ω, the measured result of the resistance will be presented on the display 11 prior to subsequent repeated measurements, during which alternating voltage is measured once every two measurements of the resistance: the measured result of the alternating voltage will be presented on the display 11 if being above or equal to 1.0V; otherwise, the repeated measurements are continued unless a resistance above 9,999Ω is found wherein the operation of the main unit is switched to the diode measuring mode;

e. In the diode measuring mode, a judgment is made whether the voltage across a diode has a measured result in a range between 0.3V and 0.9V or not; if it does, the measured result of the voltage will be presented on the display 11; if it does not, the operation of the main unit 1 will be switched to the current measuring mode;

f. In the current measuring mode, both a direct current and an alternating current are measured; if the direct current has a measured result with an absolute value above 999.9 A and the alternating current has a measured result above 999.9 A, a sign "OL" representing overflow of digits for both of the currents will be presented on the display 11; if only the direct current has a measured result with an absolute value above 999.9 A, a sign "OL" is present on the display 11 only for the direct current;

g. Provided that the direct current has a measured result with an absolute value in a range between 0.6 A and 999.9 A, a further judgment is made whether the alternating current has a measured result above 999.9 A or not; if it does, a sign "OL" will be presented on the display 11 for the alternating current; if it does not, the value of alternating voltage will be presented on the said display 11 only when that value is greater than the absolute value of the direct voltage, or the value of direct voltage will be presented; and h. Provided that the direct current has a measured result below 0.6 A but above −0.6 A, if the alternating current has a measured result in a range between 0.6 A and 999.9 A, the measured result of the alternating current will be presented on the display 11; if the alternating current has a measured result above 999.9 A, a sign "OL" will be presented on the display 11 for the alternating current; and if the alternating current has a measured result below or equal to 0.6 A, a sign "OL" will be presented on the display 11 for a high resistance.

According to the criterion 3, the main unit 1 still receives the input signals from the pair of test probes 13 when operating in the alternating/direct current measuring mode. If there is an input signal detected by the test probes 13, the operation of main unit 1 will be switched immediately to other measuring mode.

Figure 5:
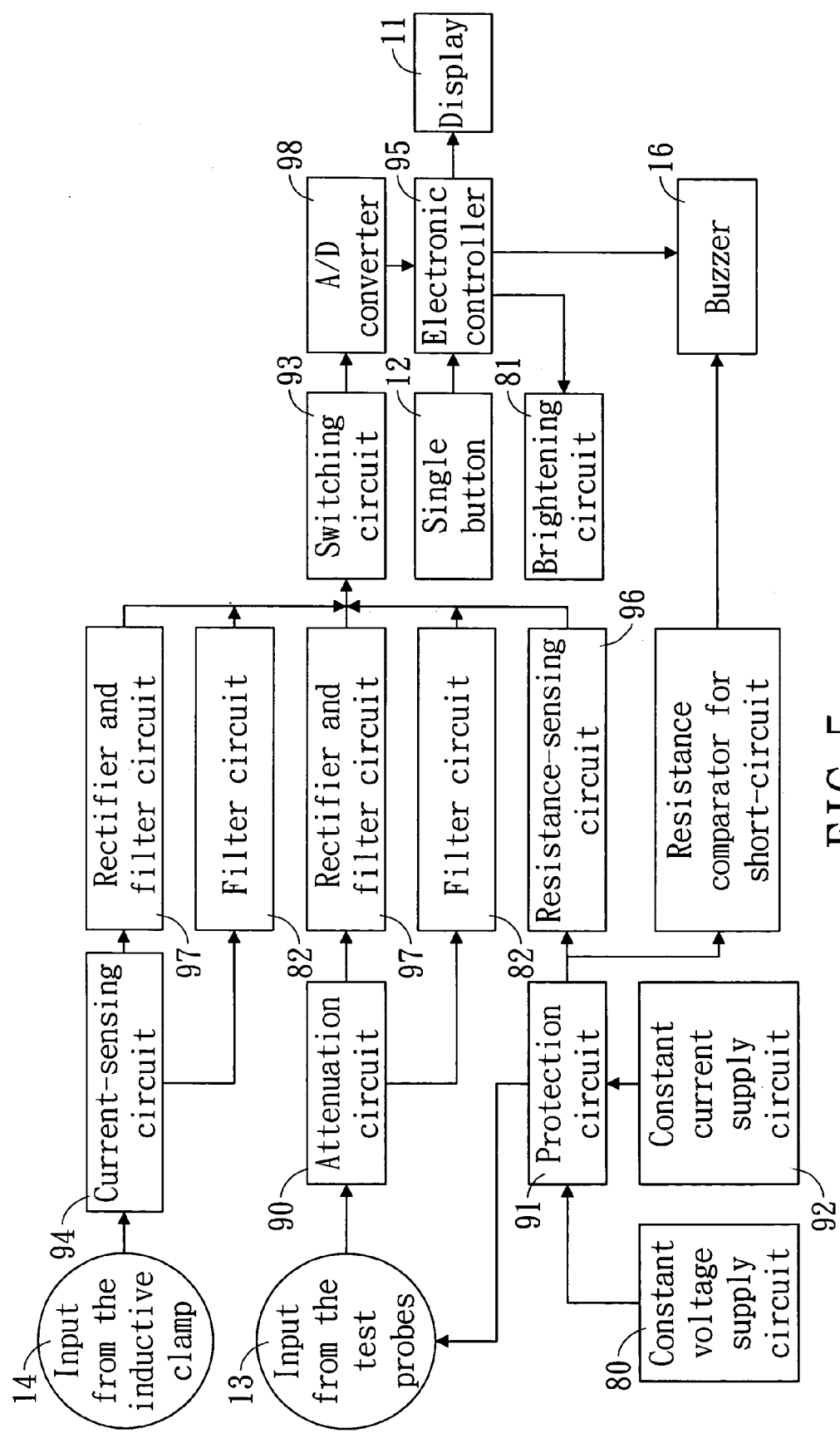
FIG. 5 is a block diagram of an internal circuitry used in the meter of FIG. 1.

Referring to FIGS. 1 and 5, there is shown a block diagram of an internal circuitry used in the main unit 1. In addition to the aforementioned display 11, buzzer 16 and the single button 12, the internal circuitry further includes an attenuation circuit 90, a protection circuit 91, a constant current supply circuit 92, a switching circuit 93, a current-sensing circuit 94, an electronic controller 95, a marking circuit 96, a first rectifier and filter circuit 97, a second rectifier and filter circuit 97', an A/D converter 98, a constant voltage supply circuit 80, a first filter circuit 82, a second filter circuit 82', and a brightening circuit 81.

The attenuation circuit 90 receives the first input signal from the pair of test probes 13 and then sends an attenuated signal both to the first rectifier and filter circuit 97 and to the first filter circuit 82. The first rectifier and filter circuit 97 sends out a DC signal indicative of an alternating voltage, and the first filter circuit 82 sends out a DC signal indicative of a direct voltage, a measurable resistance, or a diode.

The current-sensing circuit 94, preferably consisting of an amplifier, a voltage divider and the inductive clamp 14, senses an electric current flowing through the current-carrying conductor 15 and then sends a signal both to the second rectifier and filter circuit 97' and to the second filter circuit 82'. The second rectifier and filter circuit 97' sends out a DC signal indicative of an alternating current, and the second filter circuit 82' sends out a DC signal indicative of a direct current.

The constant current supply circuit 92 supplies the protection circuit 91 with a constant current during the measurement in the resistance measuring mode. Because the protection circuit 91 is electrically coupled to the pair of test probes 13, the current flows through a resistance RX between the test probes 13 and results in a voltage drop across the resistance RX. It is by measuring the voltage drop that the resistance RX can be determined according to the following formula:

$$RX = \text{voltage drop/constant current}$$

The resistance measuring mode may involve repeated measurements, during which any resistance with a measured result below a critical value is regarded as a short-circuit and is indicated by means of the display 11 and the buzzer 16.

The constant voltage supply circuit 80 supplies the protection circuit 91 with a constant voltage during the measurement in the diode measuring mode. The constant voltage is applied to a diode between the test probes 13, and the resulting voltage drop across the diode can be measured by way of the second rectifier circuit 82.

The resistant-detecting circuit 96 is electrically coupled to the protection circuit 91 for sending out a signal indicative of the presence of a measurable resistance, or a diode, or neither of them between the test probes 13, to be more precise, indicative of the functioning of the constant current supply circuit 92, or the constant voltage supply circuit 80, or neither of them.

The switching circuit 93 is controlled by the electronic controller 95 so as to selectively receive at most two of the signals sent from the rectifier and filter circuits 97 and 97', the filter circuits 82 and 82', and the marking circuit 96 at any moment and to send a signal indicative of one of the alternating/direct voltage, the alternating/direct current, the measurable resistance, and the diode to the A/D converter 98 according to the measuring mode used at that moment.

The A/D converter 98 converts a measured result carried by the at most two signals from an analog form to a digital form.

The electronic controller 95 transforms the digital measured result to a format necessary for the display 11 and consistent with the measuring modes used at that moment and controls the functioning of the brightening circuit 81 and the buzzer 16.

The brightening circuit 81 is provided for detecting the environmental darkness and for brightening the background of the display 11 in response to a signal from the electronic controller 95. This brightening circuit 81 may also be designed so as to send a signal to the electronic controller 95 when the main unit 1 is operated in a dark place and then to brighten the background of the display 11 in response to a signal sent back from the electronic controller 95.

In the present invention, the electronic controller 95 controls the operation of the switch circuit 93 by determining which one of the measuring modes is being used at that moment as a result of a judgment based on the different natures and/or different magnitudes of the input signals, and changes the operation of the display among the visual modes in response to a signal with a particular duration sent from the single button 12.

The main unit 1 may further includes a background controlling mode for automatically brightening the background of the display 11 when the main unit 1 is operated in a dark place so that the user may read the measured result on the display 11 more easily and clearly. The background-controlling mode begins to function about 2 seconds later than it is required to function in response to the environmental darkness in order to reduce the possibility of erroneous operation of itself. The main unit 1 may also include an alarm mode for warning the operator of danger when either of the pair of test probes 13 or the inductive clamp 14 detects an input signal indicative of an alternating/direct voltage or alternating/direct current but not the same electric signal associated with the measured result presented on the display 11 while the main unit 1 is in either of the holding visual mode or the max/min record visual mode, and for warning the operator when the pair of test probes 13 detects an input signal indicative of an alternative/direct voltage which is of the same type but the measured result is over 5.0V greater than the measured result presented on the display 11 or the inductive clamp 14 detects an input signal indicative of an alternative/direct current which is of the same type but the measured result is over 5.0 A greater than the measured result presented on the display 11 while the main unit is in the holding visual mode. When this alarm mode functions, the measured result presented erroneously on the display 11 will be replaced by a newly measured result.

In the present invention, as soon as the meter is turned on, the main unit 1 tests the power of enclosed batteries/cells and then presents the residual power on the display 11 as a percentage by taking 7 V as 0% and 9V as 100%, probably together with a special sign to represent an insufficient power below 7V. The power is tested once every 3 minutes after the main unit 1 was turned on.

Although the embodiment together with structures and functions of the present invention has been described in detail, many modifications and variations may be made from the teachings disclosed above. Therefore, it should be understood by those skilled in the art that any modification or variation equivalent to the spirit of the present invention should be regarded to fall into the scope defined by the appended claims.

What is claimed is:

1. An auto-measuring universal meter, comprising:
a main unit having a display and a single button;
a pair of test probes electrically connected to said main unit in a removable manner to detect a first input signal; and
an inductive clamp formed on and electrically connected to said main unit for gripping a current-carrying conductor to detect a second input signal indicative of an alternating/direct current flowing through said current-carrying conductor;
wherein said main unit measures said input signals in a self-judging mode based on the presence of and/or the differences between said input signals so that said alternating/direct current is measured,
wherein said self-judging mode further includes an alternating voltage measuring mode, a direct voltage measuring mode, an alternating current measuring mode, a resistance measuring mode, and a diode measuring mode,
wherein said main unit measures said input signals in said self-judging mode based on a criterion that said first input signal takes priority for measurement over said second input signal,
wherein said main unit has an internal circuitry comprising:
an attenuation circuit for receiving said first input signal from said pair of test probes and then sending an attenuated signal both to a first rectifier and filter circuit and to a first filter circuit; said first rectifier and filter circuit sending out a DC signal indicative of an alternating voltage, and said first filter circuit sending out a DC signal indicative of one of a direct voltage, a measurable resistance, and a diode;
a current-sensing circuit for sensing an electric current flowing through said current-carrying conductor and then sending a signal both to a second rectifier and filter circuit and a second filter circuit, said second rectifier and filter circuit sending out a DC signal indicative of an alternating current, and said second filter circuit sending out a DC signal indicative of a direct current;
a protection circuit electrically coupled to said pair of test probes;
a constant current supply circuit for supplying said protection circuit with a constant current necessary during the measurement in said resistance measuring mode;
a constant voltage supply circuit for supplying said protection circuit with a constant voltage necessary during the measurement in said diode measuring mode;
a resistance-detecting circuit electrically coupled to said protection circuit for sending out a signal indicative of the presence of either of said measurable resistance and said diode between said test probes;
a switching circuit controlled so as to selectively receive at most two of said signals sent from said rectifier and filter circuits, said filter circuits, and said resistance-detecting circuit at any moment and to send out a signal indicative of one of said alternating/direct voltage, said alternating/direct current, said measurable resistance, and said diode;
an A/D converter for converting a measured result carried by said at most two signals from an analog form to a digital form;
an electronic controller for transforming said measured result in said digital form to a format necessary for said display and consistent with one of said measuring modes which is used at that moment; and
a brightening circuit for detecting the environmental darkness and for brightening the background of said display in response to a signal from said electronic controller.

2. The auto-measuring universal meter as claimed in claim 1, wherein said switching circuit is controlled by said electronic controller so as to operate according to said one of said measuring modes which is used at that moment.

3. The auto-measuring universal meter as claimed in claim 1, wherein said electronic controller controls the operation of said switch circuit by determining which of said measuring modes is being used at that moment as a result of a judgment based on the different natures and/or different magnitudes of said input signals, and wherein said electronic controller changes the operation of said display among said visual modes in response to a signal with a particular duration sent from said single button.

4. The auto-measuring universal meter as claimed in claim 1, wherein said brightening circuit sends a signal to said electronic controller when said main unit is operated in a dark place and then to brighten said background of said display in response to a signal sent back from said electronic controller.

* * * * *